United States Patent [19]

Avedissian

[11] Patent Number: 4,634,043

[45] Date of Patent: Jan. 6, 1987

[54] ENGAGING SECOND ARTICLES TO ENGAGED FIRST ARTICLES

[75] Inventor: Michael K. Avedissian, Mohnton, Pa.

[73] Assignee: AT&T Technologies, Inc., Berkeley Heights, N.J.

[21] Appl. No.: 652,388

[22] Filed: Sep. 20, 1984

[51] Int. Cl.$^4$ .............................................. B23K 31/02
[52] U.S. Cl. ................................. 228/180.2; 228/44.3
[58] Field of Search ....................... 228/1.1, 44.3, 110, 228/6.2, 180.2; 269/21; 294/64.1; 29/840, 740

[56] References Cited

U.S. PATENT DOCUMENTS

| | | | |
|---|---|---|---|
| 3,458,102 | 7/1969 | Zanger et al. | 228/3 |
| 3,568,307 | 3/1971 | Zanger et al. | 29/589 |
| 3,584,859 | 6/1971 | Siron | 269/21 |
| 3,676,911 | 7/1972 | Austin | 29/203 |
| 3,695,502 | 10/1972 | Gaiser | 228/4 |
| 3,873,144 | 3/1975 | Diepeveen | 228/44.7 |
| 4,295,596 | 10/1981 | Doten et al. | 228/180 |

FOREIGN PATENT DOCUMENTS

| | | | |
|---|---|---|---|
| 56-80141 | 7/1981 | Japan | 269/21 |
| 57-104220 | 6/1982 | Japan | 269/21 |
| WO82/02235 | 7/1982 | PCT Int'l Appl. | |

Primary Examiner—Nicholas P. Godici
Assistant Examiner—G. M. Reid
Attorney, Agent, or Firm—Wendy W. Koba

[57] ABSTRACT

A head (45) engages a chip (10) having peripheral sides (16), and then engages the chip (10), to a workpiece (35) for bonding chip (10) to a substrate (30). Body (46) has a lower portion terminating in a downwardly presented, working face (48). For receiving chip (10), face (48) has a cavity (54) formed by a plurality of inwardly and upwardly directed surfaces (56). Such surfaces (56) engage upper edges of, and position a chip (10) such that at least a portion of the peripheral sides (16) protrude from working face (48). Body (46) includes a vacuum bore (58) adapted for connection between face (48) and a vacuum for removably engaging and holding chip (10) against surfaces (56). Pockets (60) are also provided in face (48) and connected to a vacuum for moving air streams toward face (48) at the sides (16) of an engaged chip (10). Such streams are sufficient in force, direction and distribution around the sides (16) that when an engaged chip (10) is moved adjacent to a free workpiece (35), the air streams capture portions (38) and hold workpiece (35) against chip (10). The chip (10) and the workpiece (35) may be simultaneously registered to a site (32) on a heated substrate (30). Then workpiece (35) becomes liquefied and is uniformly applied and reacted to contact surfaces for the bonding. The pockets (60) may be directly supplied by the same vacuum for engaging chip (10) or to a different vacuum. Alternatively, the pockets (60) may open into cavity (54) such that a vacuum sufficient to engage chip (10) and then the workpiece (35).

6 Claims, 8 Drawing Figures

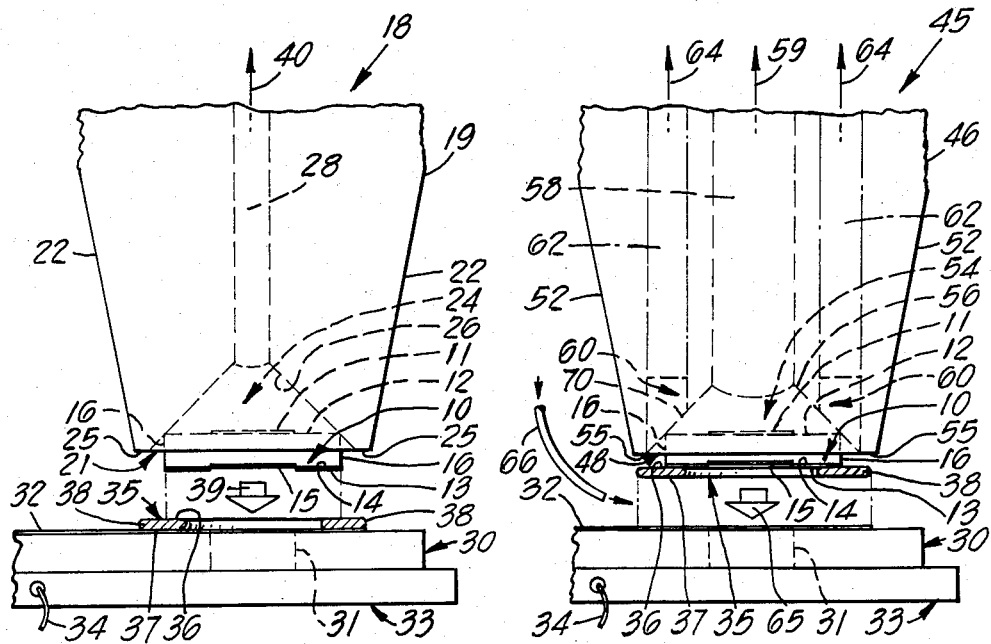
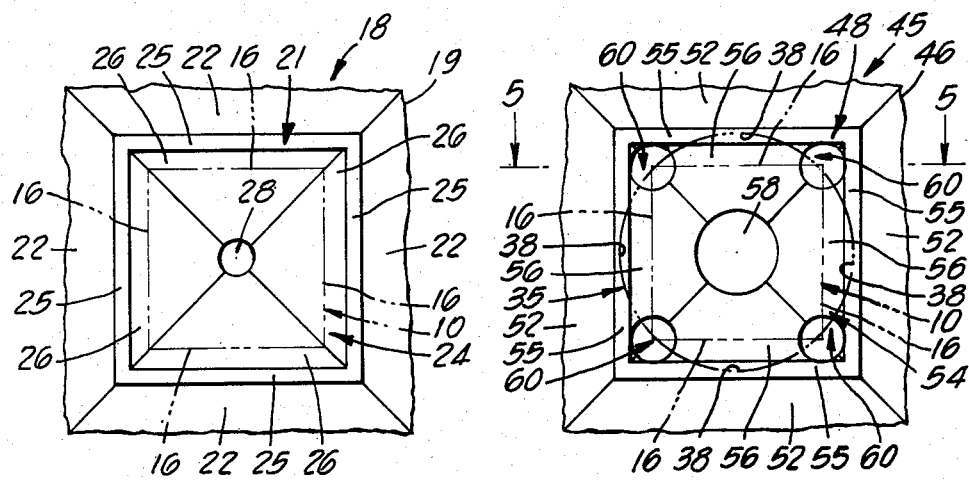
FIG. 1
PRIOR ART
FIG. 3
FIG. 2
PRIOR ART
FIG. 4

ENGAGING SECOND ARTICLES TO ENGAGED FIRST ARTICLES

TECHNICAL FIELD

This invention relates to removably engaging a first article and then engaging a second article to the engaged first article. More particularly, this invention relates to expedients such as a head for removably engaging a solid state chip of the type to be bonded to a heated substrate and then engaging to the chip, a workpiece of material typically liquefied by heat for the bonding.

BACKGROUND OF THE INVENTION

One of the most popular methods of assembling parts without mechanical fasteners is to join surfaces of the respective parts with an intermediate substance, sometimes called a bonding material. Although there are many such bonding materials, the types discussed in this application are those which are liquefied by heat for the bonding. A problem is to select a bonding material and apply the same to suit a method by which parts are assembled to acquire joints having desired characteristics.

A challenging task is to bond an often delicate, electronic chip with precise registration to a substrate and with a joint having good conductivity of electricity and operating heat. One typically starts by metallizing the surfaces to be joined. Then a metal or a metal alloy is typically selected which will react with the surface metals to form an alloy having the conductivity and/or other desired characteristics. A problem is to liquefy and uniformly distribute the bonding material over the surfaces to be joined. Another problem is to obtain a uniform and desired reaction time over the joint and between the bonding material and the surface metals.

A desirable method of achieving uniform distribution is to first form a solid workpiece of bonding material (called a "preform") and place the same between cold surfaces prior to any heating. Such method assures a uniform and desired reaction time providing heat is uniformly applied and uniformly and timely removed. Oxidation of surfaces and bonding material at elevated temperatures is mitigated because the cold joining tends to mitigate air in a joint during a later heating step. A problem is that uniform heating is often done in a chamber away from an assembly station. Many electronic chip assemblies are so tiny, precise and delicate that clamping and moving steps risk damage to chips and their respective registration to substrates.

Uniform heating at an assembly station is often achieved by heating a substrate (rather than a vulnerable chip). A problem is to control liquefication of a preform of bonding material while the preform and a chip are being registered to a site on a substrate. If heat is avoided until after registration of the preform and chip, respectively, an unacceptable waiting period is experienced during the heating step. If the heat is applied before registration, the preform liquefies and oxidizes while the chip is being registered to the preform.

Accordingly, it is desirable to provide new and improved expedients for bonding a first article such as a chip to a substrate utilizing a second article such as a preformed workpiece of bonding material. It is preferred to engage a chip and then engage the preform to the chip, before contacting either article to a heated substrate.

SUMMARY OF THE INVENTION

Expedients including heads are provided for removably engaging a first article having peripheral sides, such as a chip, and then engaging to the engaged chip, a second article, such as a workpiece of bonding material. Such engaged articles may then be simultaneously registered for bonding the chip via the bonding material to a site on a heated substrate.

In one embodiment, a body has an upper portion adapted for support and a lower portion terminating in a downwardly presented working face. Such working face may have flat, smooth surfaces for receiving the chip.

In a presently preferred embodiment, the working face has a vacuum cavity formed by a plurality of inwardly and upwardly directed surfaces for engaging and positioning the chip such that at least a portion of the peripheral sides protrude from the working face. A vacuum bore in the body is adapted for a first connection between a vacuum source and the working face for removably engaging the chip and for holding the same against the engaging surfaces.

In another embodiment, at the periphery of an engaged chip, expedients are provided for moving air streams toward the working face at the peripheral sides of the engaged chip. For example, pockets having a second connection to a vacuum source, may be provided to move air at or intermediate the corners at the periphery of an engaged chip. The streams of air into the pockets are sufficient in force, direction and distribution around the peripheral sides to engage a free workpiece of bonding material. For example, when an engaged chip is moved adjacent to such a free workpiece, the air streams capture sufficient peripheral portions of the workpiece to engage and hold such workpiece against the chip. Then the chip and workpiece may be simultaneously registered to a site for operations such as bonding.

BRIEF DESCRIPTION OF THE DRAWING

The invention will be more readily understood from the following detailed description when read in conjunction with the drawing wherein:

FIG. 1 is an elevation view of a prior art head adapted for registering a chip to a workpiece of bonding material which has been previously applied to a heated substrate according to the prior art;

FIG. 2 is a bottom view of the head shown in FIG. 1 revealing features of a working face;

FIG. 3 is an elevation view of a head adapted for removably engaging a chip and then engaging a workpiece to the chip prior to registering either article to a heated substrate in accordance with an embodiment of the invention;

FIG. 4 is a bottom view of the head shown in FIG. 3 revealing features in a working face including pockets at chip corners for moving and directing air streams in accordance with an embodiment of the invention;

Figure 5A:
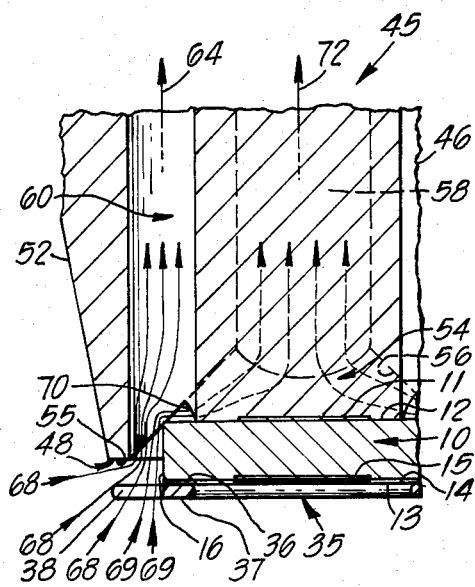
FIG. 5A is a greatly enlarged, partial view in section of the head shown in FIG. 4, taken along line 5—5, depicting air streams drawn from first and second vacuum connections in accordance with an embodiment of the invention.

Some of the elements in the figures are abbreviated or simplified to highlight features of the invention. Also, where appropriate, reference numerals have been repeated in the figures to designate the same or corresponding features in the drawing.

DETAILED DESCRIPTION

The Articles And Prior Art Pickup Heads

FIGS. 1-7 show solidly or in outline, a typical first article 10 which may be removably engaged in the practice of the invention. By removably engaged, it is meant that an article may be drawn against, or otherwise attracted and held to, apparatus such as a pickup head. While so engaged, the article may be manipulated with the head and readily disengaged for fixed or free placement in an assembly or on a substrate.

Except for FIG. 2, the same figures show solidly or in outline, a typical second article 35 which may be engaged to an engaged first article 10 in the practice of the invention. The first article 10 will now be described followed by the prior art pickup heads and the second articles 35.

The first article 10 is illustrated and will be discussed primarily with respect to solid state chips because of their challenging handling problems. More particularly, a solid state chip containing an optical device is selected, also designated generally by the numeral 10. Chip 10 may include a PIN photodiode which generates electrical signals in fast response to received radiation such as light pulses from a source (not shown).

Chip 10 may typically be constructed of III-V compounds as set forth in the Periodic Table of Elements. For example, chip 10 may contain a binary, InP substrate of a type which is transparent to a desired wavelength of radiation. A ternary, InGaAs intrinsic layer may be grown on the substrate for electron-hole generation by the radiation. A diffused P doped region may communicate between the intrinsic layer and a metallized contact 11 on a top, major surface 12 of chip 10. Also, an N doped region may communicate between the intrinsic layer and a metallized, frame-shaped contact 13 on a bottom, major surface 14 of chip 10. The diode may be reverse-biased, creating an electric field across the intrinsic layer. When radiation enters the chip through an active region 15, electrons are freed and a current flows toward the frame contact 13. The binary substrate, the ternary layer and the diffused regions are not delineated in the figures. The contacts 11 and 13 and the active region 15 are depicted symbolically.

Chip 10 may be as little as about 0.023 inches (0.6 mm) square by about 0.004 inches (0.1 mm) thick and have rectangular sides 16 which are substantially uniform in size, shape and surface texture. The major surfaces 12 and 14 are closely parallel to one another and the peripheral sides 16 are substantially perpendicular to the major surfaces.

Because of the microminiature size of chip 10, highly magnified viewing and sensitive handling techniques are required for registering and bonding it to a substrate. A head 18 is shown (in an elevation view in FIG. 1 and in a bottom view in FIG. 2) for pickup and placement of articles such as a semiconductor chip 10. Head 18 is especially advantageous for such work because contact to the major surfaces 12 and 14 is avoided, stresses applied to the described chip structure are low and orientation of chip 10 is effectively controlled.

Head 18 has a cylindrical body 19 which may be about 0.063 inches (1.6 mm) in diameter by about 0.75 inches (19.0 mm) long, but much of the body cannot be shown in FIGS. 1 and 2 because of the large scale of the figures. Body 19 has an upper portion (not shown) which is adapted for support and a lower portion terminating in a downwardly presented working face 21 best seen in FIG. 2. From the periphery of body 19 to the working face 21, tapered surfaces 22 are provided which in this case are uniform in dimension because working face 19 is adapted to handle square chips 10. Surfaces 22 are usually provided by grinding because body 19 is typically made of a very hard material such as heat treated steel, ceramic, titanium carbide or tungsten carbide to resist wear from the articles which are engaged to head 18.

In working face 21, a cavity 24 is formed by four uniformly dimensioned walls 25 having four uniformly dimensioned, inwardly and upwardly inclined surfaces 26. Surfaces 26 are for engaging corresponding top edges of sides 16 of a chip 10. Surfaces 26 are converged to a bore 28 extending through the body 19 and adapted for connection to a vacuum source (not shown) to draw air according to arrow 40 (FIG. 1).

It is desirable that the diameter of bore 28 be adequate to pass air flow during engaging a chip 10 and that the vacuum source be of sufficient strength and air moving capacity to hold chip 10 while it is registered by head 18. For example, it is found adequate for the illustrative chip 10 and head 18 that bore 28 be about 0.006 inch (0.15 mm) in diameter and that a vacuum source pass about 0.02-0.12 CFM of air while holding vacuum at about 5 psia. Note that bore 28 is small because chip 10 is light in weight and seats well in cavity 24 with few and small clearance spaces to pass air. It will be appreciated that the illustrative head 18, with its ancillary features does a fine job of securing a chip 10 until it is registered on a site on a substrate.

FIG. 1 shows a typical substrate 30, also referred to herein as a thin slab 30, (which may be made of alumina ceramic, beryl mineral or silicon) having a central opening 31. After assembly, the slab 30 may be erected and so oriented that a beam of light will pass into opening 31 and into the active region 15 of chip 10. A site 32 for bonding is provided by a contact layer of gold (also designated by the numeral 32) extending to a circuit (not shown) to process signals generated in chip 10. Under slab 30, there is a heater 33 having a cord 34 for connection to a control and a power source (neither shown).

The contacts 11 and 13 on chip 10 typically have gold metalization so oxidation is not a problem at room temperatures. However, the III-V construction of a chip 10 is known to be brittle and weak, especially in tiny, thin shapes. Consequently, a gentle bonding method is indicated which minimizes residual stresses in a chip 10 and a bonded joint. Also, the joint should be highly conductive of operating electricity and heat from chip 10 to the conductive site 32 on the substrate 30.

To bond chip 10 to site 32, a bonding material is selected such as an alloy containing, by weight, 12% Ge and 88% Au which melts sharply and uniformly at about 356° C. and is compatible with the metals of contact 13 on chip 10 and the layer 32 on substrate 30. Such bonding material is initially formed from a bulk source (not shown) and typically punched into a preformed article to suit chip 10 and the bonding site 32. In the illustrative example, such preformed article is the second article 35 which will also be referred to as a workpiece 35.

Workpiece 35 may be about 0.034 inch (0.86 mm) outside diameter by about 0.018 inch (0.46 mm) inside diameter by about 0.001 inch (0.025 mm) thick and have major surfaces 36 and 37. Workpiece 35 is broader than chip 10 along chip sides 16 and such broader peripheral portions are designated by the numeral 38. Such a workpiece 35 is placed in a joint to achieve uniform distribution of bonding material over joining surfaces and to mitigate oxidation by mitigating air presence at surfaces 36 and 37 at high temperatures.

Heating the workpiece 35 to achieve liquidation of bonding material has been a problem when such microminiature articles 10 and 35 are involved and precise registration to a site 32 is desired. In the prior art, one typically was faced with a dilemma. If heater 33 was not activated until after precise registration of the workpiece 35 and the chip 10, respectively, an unacceptable waiting period was experienced during a heating step. If the heater 33 was activated before registration, the workpiece 35 often liquified and became oxidized while chip 10 was being registered to the site 32.

Compromise procedures were often utilized with only limited success. For example, heater 33 was sometimes activated to heat substrate 30 while head 18 was manipulated to bring its working face 21 with a chip 10 close to the site 32. When the workpiece 35 was slipped under chip 10 and manually aligned to site 32 (FIG. 1), a race was on to register chip 10 (according to arrow 39) before workpiece 35 was liquified and/or oxidized. The result was that workpiece 35 or chip 10 or both were often improperly registered and an ensuing joint sometimes had substandard conductivity characteristics.

IMPROVED HEADS

FIG. 3 is an elevation view and FIG. 4 is a bottom view of an improved head 45 for successively engaging an article 10 and 35, respectively, and for registering the same to a site 32 on a substrate 30 in accordance with one embodiment of the invention. Head 45 has features similar to head 18 for similar functions and new features for new functions.

Head 45 includes a cylindrical body 46 having dimensions and materials of construction similar to body 19 of head 18. An upper portion (not shown) is adapted for support and a lower portion of body 46 terminates in a downwardly presented working face 48 best seen in FIG. 4. Because head 45 is adapted for engaging a square chip 10, many corresponding features of body 46 and face 48 are uniform in dimensions and shape. For example, tapered surfaces 52 are provided (such as by grinding) from the periphery of body 46 to a cavity 54 formed by four walls 55 having four similar, inwardly and upwardly inclined surfaces 56. Surfaces 56 are for engaging corresponding top edges of sides 16 of a chip 10. Surfaces 56 converge to a first bore 58 extending through the body 46 and adapted for a first connection to a vacuum source (not shown) for moving air according to arrow 59 which will be explained later.

The working face 48, the cavity 54 and a method of engaging a chip 10 to surfaces 56 in head 45 will now be explained by contrast to head 18. Working face 48 is made wider than working face 21 to accommodate in cavity 54 a plurality of pockets 60 located as best seen in FIG. 4. Pockets 60 are provided in the corners of cavity 54 roughly centered at the corners of a chip 10 when such chip is engaged to head 45.

It has been mentioned with respect to head 18, that few and small clearance spaces are available to pass air into cavity 24 when a chip 10 is engaged to surfaces 26. Such a condition was previously found desirable to mitigate the air moving capacity needed at a vacuum source serving head 18. However, head 45 is provided with pockets 60 for exactly the opposite purpose. The pockets 60 are provided to move (or to permit movement of) air streams toward working face 48 at the peripheral sides 16 of a chip 10 when said chip is engaged in cavity 24.

Such air streams should be sufficient in force, direction and distribution around sides 16 that when head 45 moves an engaged chip 10 adjacent to a free workpiece 35, said workpiece becomes engaged as shown in FIG. 3. In the illustrative embodiment, the air streams produce sufficient force adjacent peripheral portions, e.g., portions 38, of workpiece 35 that the workpiece is engaged and held against the chip 10.

The air streams are found to have sufficient force for a workpiece 35 when about 0.06 to about 0.12 CFM of air is moved through the pockets 60 and the streams are confined along the sides 16 of a chip 10 as shown in FIG. 3. The air streams are found to be sufficient in direction when they are directed substantially vertically along the sides 16 of an engaged chip 10. Sufficient distribution of the air streams is obtained for chip 10 and workpiece 35 when ones of pockets 60 are located at each corner of an engaged chip 10 as shown in FIGS. 3 and 4.

The pockets 60 are about 0.007 inch (0.18 mm) in diameter and about 0.010 inch (0.25 mm) deep, measured from the bottom surface of a wall 55. Such pockets may be conveniently provided in a tungsten carbide body 46 by electrical discharge methods of cutting. For example, a wire electrode may be at a first polarity from a power source (not shown) and body 46 may be at a second polarity to complete a circuit to such source. When the electrode is brought to a pocket site, an arc discharges to body 46 and material is eroded. Such work is often done in an oil bath for heat control.

The word "pockets" is used to describe recessed features for controlling air streams and reflect the appearance of the recessed features shown in the figures. Nevertheless, it is to be understood that the invention is not limited to the recessed features shown. Features such as ducts, holes, apertures, channels and similar recesses or conduits with or without directional devices such as vanes may be equally effective in moving (or controlling movement) of air streams. For example, the embodiment illustrated in FIG. 3, utilizes only a first vacuum connection to bore 58 to move the air streams. However, it will be shown to be equally effective to use ducts 62 (shown in phantom lines) to make second connections to a vacuum source according to arrows 64. It is to be understood that the first and second connections made be made to the same or separate vacuum sources. Such source or sources can readily be adapted to provide adequate air moving capacity and a vacuum pressure (i.e., well below 14.7 psia) suitable for the engaging.

When proper pockets 60, adequate vacuum and good connections are provided, head 45 will readily, removably engage a chip 10 as shown in FIG. 3. Moreover, head 45 will also then readily engage an adjacent, free workpiece 35, also shown in FIG. 3. Relative motion is then produced between head 45 and a heated substrate 30, but the workpiece 35 is held away from the heat in a solid, unoxidized state and engaged to chip 10 until contact is made to substrate 30 by such motion according to arrow 65. Then the workpiece 35 of bonding material liquefies substantially without the presence of air to contacts 13 and 32. The substrate 30, including the registered articles 10 and 35 may subsequently be cooled such as by gas from a tube 66 connected to as gas source (not shown). Alternatively, the power to heater 33 may be deactivated, the substrate may be moved or both, to achieve cooling and complete a bond of chip 10 to site 32 on substrate 30.

Figure 5B:
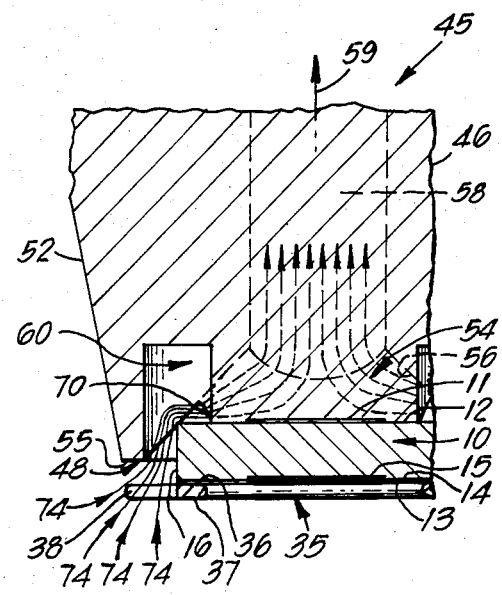
FIG. 5B is similar to FIG. 5A, but air streams are drawn from only a first vacuum connection in accordance with an embodiment of the invention.

FIGS. 5A and 5B show in greater detail, two methods of moving air streams in the practice of various embodiments of the invention. For convenience of explanation and to avoid repeating similar descriptions, the partial views are both assumed to be taken along line 5—5 in FIG. 4. Also, for contrast, the head in FIG. 5A will be assumed to be a head 45, with ducts 62 provided and the head in FIG. 5B will be assumed to be a head 45, without ducts 62.

FIG. 5A depicts, for ease of description, air streams 68 and 69 as though a body of moving air can be divided into discrete portions. Such streams 68 and 69 originate at walls 55 and adjacent to sides 16 and lower surface 14 of a chip 10. Streams 68 are drawn into pockets 60, through ducts 62 and second connections to a vacuum source (which could be common) according to arrow 64. Streams 69 are drawn into pockets 60, through apertures 70, cavity 54, the bore 58 and a first connection to a vacuum source (which could be the common source) according to arrow 72.

The four pockets 60 pass a total of about 0.20 CFM of air. About 60 to 80% is passed through the ducts 62 and about 20 to 40% is passed into apertures 70 and through the bore 58. Such information is offered by way of explaining the requirements and sizes of pockets 60, ducts 62, the bore 58 and a vacuum source and not by way of limiting the invention.

It is not fully understood how the air streams operate to engage the second article 35. According to one explanation, the air streams lower the air pressure between walls 55 and the sides 16 and draw portions 38 of the workpiece 35 toward the working face 48. According to another explanation, such drawing is accompanied by a lowering of air pressure under chip 10 by air streams 69 moving over surface 14, a phenomena known as the "Coanda" effect. Such effect would explain an observed snapping action by workpiece 35 against chip 10 which is enhanced by movement of air through the open center portion of workpiece 35 just prior to engagement. Another explanation is that the flow of air at the periphery of chip 10 simply engulfs peripheral portions 38 (and others) of workpiece 35 and draws the workpiece against chip 10.

By reference to FIG. 4, it is seen that the portions 38 do not significantly protrude away from chip 10 at chip corners. Since section 5—5 is taken at such corners, the corner regions are seen to have better access for air than the sides regions and the air streams 68 and 69 follow the paths shown in FIG. 5A.

A presently preferred method of moving air streams through pockets 60 in a head 45 is shown in FIG. 5B. Air streams 74 are depicted, originating at walls 55 and adjacent to sides 16 and the lower surface 14 of a chip 10. Streams 74 are drawn into the pockets 60, through apertures 70, cavity 54, the first bore 58 and a first connection to a vacuum source according to arrow 59.

About 0.06 to about 0.12 CFM of air is passed by pockets 60 through aperture 70 and the bore 58. Such air quantity is significantly less than the air passed by utilizing ducts 62. Nevertheless, it is found that sufficient air with sufficient force is provided to engage a workpiece 35 to the chip 10.

It will be observed that the pockets 60 are located partially outward and partially inward of the periphery of an engaged chip 10. Also, the pockets 60 are of such width and depth that the inward portion of a pocket opens into and communicates with the vacuum cavity 54 through apertures 70. By such construction, the bore 58 aids in moving air when ducts 62 are utilized as in FIG. 5A. Even more advantageous, such construction permits bore 58 (and a first vacuum connection to a source for holding chip 10) to communicate with the pockets 60 and move air streams 74 to engage workpiece 35 (FIG. 5B) without the ducts 62.

Figure 6:
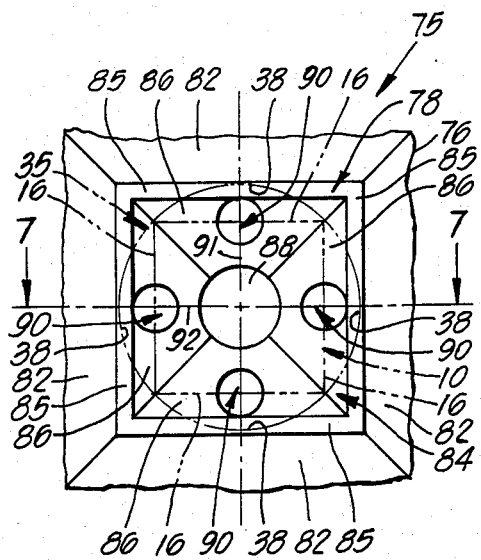
FIG. 6 is a bottom view of a head having pockets located intermediate of the chip corners in accordance with the invention.
Figure 7:
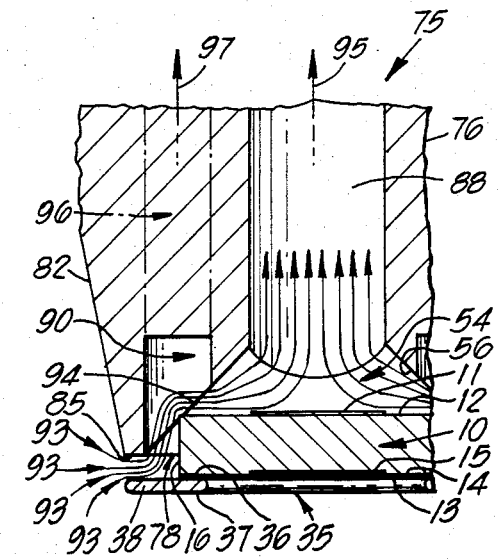
FIG. 7 is a greatly enlarged sectional view of the head shown in FIG. 6, taken along line 7—7, depicting air streams drawn from a first vacuum connection through pockets and a vacuum bore in accordance with an embodiment of the invention.

FIGS. 6 and 7 illustrate still another embodiment of the invention including a head 75 having a body 76 much like the body 46 of head 45. Other features are similar to those of head 45. For example, a working surface 78, tapered surfaces 82, cavity 84, walls 85, engaging surfaces 86 and bore 88 are similar in form and function to respective working surface 48, tapered surfaces 52, cavity 54, walls 55, surfaces 56 and the bore 58 of head 45. However, pockets 60 for moving, directing and distributing air streams are located at the sides 16 of a chip 10, i.e., at positions intermediate chip corners. Such locations are advantageous for some applications because portions 38 of the workpiece 35 are more prominent at the natural center lines 91 and 92 of head 75. Accordingly, the air streams have more of workpiece 35 to engulf and grasping an article 35 is more efficient.

FIG. 7 depicts air streams 93 moving through the pockets 90 in a head 75 for engaging first and then second articles. Air streams 93 originate between walls 85 and adjacent to the sides 16 and lower surfaces 14 of a chip 10 (as in FIG. 5A) and pass to a vacuum source according to arrow 95. However, as a workpiece 35 becomes engaged to a chip 10 as shown in FIG. 7, there is better engagement with less air movement required. Each aperture 94 in head 75 is larger than an aperture 70 shown in head 45 in FIGS. 5A and 5B. However, the passageways for air streams 93 moving between walls 85 and portions 38 of workpiece 35 are much smaller than those for head 45. Consequently, head 75 does an excellent job of engaging and holding workpiece 35 while passing less air than head 45. Note further that ducts 96 may be provided, having second connections to a vacuum source for passing air according to arrow 97, to serve the pockets 90.

It has been noted that workpiece 35 has edge portions 38 which protrude from peripheral sides of the chip 10 and such portions are engaged by the air streams. Also, it is seen in the figures that workpiece 35 is a substantially flat article. However, it is found that workpiece 35 need not be broader than chip 10 nor need such workpiece be flat. It is sufficient that workpiece 35 be of a conventional size for preformed bonding materials, i.e., that the workpiece be about as broad as, and roughly conform to, the article to be bonded.

Although PIN chip 10 has been selected for illustration and description, it is to be understood that the invention is not so limited. Many of the problems seen in using a preform to bond chip 10 to a substrate 30 are similar to, although more difficult than, the problems seen in bonding other solid state chips which may also be handled and bonded according to the invention. Also, the invention is not limited to square or rectangular chips or even to solid state chips. Article 10 could as well be a disc-like article or any other article having peripheral sides along which air streams could be moved to engage a second article.

When it is recited that air is moved toward the working face 48 of a head 45, it is meant that air is drawn or propelled toward such face. The illustrative embodiments show several expedients for drawing air streams toward a working face. However, it is within the scope of the invention to utilize tubes and similar devices to propel air streams toward a working face from below an article 10 and along its peripheral sides to engage a second article 35 to an engaged first article 10.

There have been illustrated herein certain practical embodiments and applications of the invention. Nevertheless, it is to be understood that various modifications and refinements may be made and used which differ from the disclosed embodiments without departing from the spirit and scope of the present invention.

What is claimed is:

1. A method of removably engaging to a head, a first article having peripheral sides and then engaging a second article to the engaged first article, comprising:
    supporting a body by connection to an upper portion of the body such that a lower portion terminates in a downwardly presented working face;
    receiving the first article at said working face, against surfaces for engaging such that at least a portion of the peripheral sides of said first article protrude from said working face;
    removably engaging a first article utilizing a vacuum bore adapted for first connection between said working face and a vacuum source for engaging and holding the first article against said engaging surfaces; and
    moving air streams toward said working face at the peripheral sides of an engaged first article, such streams being sufficient in force, direction and distribution around said peripheral sides that when the engaged first article is moved adjacent to a free second article, the air streams capture sufficient peripheral portions of said second article against the first article.

2. A method head as in claim 1 wherein the step of moving air streams further comprises:
    moving air through a plurality of pockets in said working face and through at least one second connection to a vacuum source, said pockets being sufficiently distributed around an engaged first article and being so oriented that the air streams are moved into the pockets in a direction along and close to side portions of said first article with such force that an adjacent free second article is engaged to and held against the engaged first article.

3. A method as in claim 2 wherein the air streams are moved through pockets located in the working face at the corners of an engaged first article.

4. A method as in claim 2 wherein the air streams are moved through pockets located in the working face between the corners of and along the sides of an engaged first article.

5. A method as in claim 2 wherein the first article has substantially flat upper and lower surfaces and a plurality of sides having top edges for engaging said first article and wherein the receiving step and the air moving step further comprise:
    receiving said article at a vacuum cavity formed in the working face of the body by a plurality of inwardly and upwardly directed surfaces converging to the first vacuum bore for engaging corresponding top edges of the first article to said surfaces sufficiently to hold such article with a desired orientation and with a lower portion of said first article protruding from said working face;
    directing the air streams through each of the pockets and into the vacuum cavity by locating said pockets partially outward and partially inward of the periphery of an engaged first article and forming said pockets of such width and depth that the inward portion of a pocket opens into and communicates with the vacuum cavity such that a first connection to a vacuum source for holding the first article communicates with the pockets and also moves the air streams; and
    moving the air streams through said first connection utilizing a vacuum source of sufficient air moving capacity and strength to hold the first article and then engage and hold the second article.

6. A method as in claim 5 wherein the first article is a solid state chip of the type adapted for bonding to a heated substrate and the second article is a workpiece of a material type liquefied by heat for such bonding, further comprising:
    producing relative motion between the head and the heated substrate such that the workpiece of bonding material remains away from the substrate in a solid and unoxidized state and engaged to the chip held in the head until contact is made to the substrate by such motion, at which time the workpiece of material liquefies and bonds the chip to the substrate, substantially avoiding unwanted oxidation of joining surfaces and bonding material.

* * * * *